United States Patent [19]

Morris

[11] 4,317,052
[45] Feb. 23, 1982

[54] APPARATUS FOR CONVERTING AN A.C. INPUT SIGNAL TO A RECTIFIED AND SMOOTHED D.C. SIGNAL

[75] Inventor: Darryl C. Morris, Concord, N.H.

[73] Assignee: Northern Telecom, Inc., Nashville, Tenn.

[21] Appl. No.: 110,476

[22] Filed: Jan. 8, 1980

[51] Int. Cl.³ .......................... H03K 5/00; H02M 7/00
[52] U.S. Cl. .................................. 307/261; 307/492; 328/26; 328/145; 363/44; 363/125
[58] Field of Search .................... 328/26, 145; 363/37, 363/44–48, 53, 125; 307/261, 492

[56] References Cited

U.S. PATENT DOCUMENTS

| 3,942,095 | 3/1976 | Togneri et al. | 328/26 X |
| 4,013,955 | 3/1977 | Wagner | 328/26 X |
| 4,109,308 | 8/1978 | Rödel | 328/26 X |

OTHER PUBLICATIONS

EDN Design Awards, Full-Wave Rectifier Need Only Two Precision Resistors, by Steve Smith, Jan. 5, 1975, p. 56.
EDN, Measure Differential A.C. Signals Easily with Precision Rectifier by J. Graeme, Jan. 20, 1975, pp. 45–48.

Primary Examiner—Stanley D. Miller, Jr.
Assistant Examiner—B. P. Davis
Attorney, Agent, or Firm—Spencer & Kaye

[57] ABSTRACT

Offset voltages of a precision rectifier circuit, buffer amplifiers, and an input comparator of a log converter are compensated for by charging a coupling capacitor to the combined total offset voltage of the apparatus. The charging is effected by causing the comparator to operate as a unity gain inverting amplifier during part of the operating cycle of the log converter when the comparator output signal is not used, so that the log converter operation is not adversely affected. During such charging the input of the precision rectifier circuit, to which the a.c. input signal is normally applied, is grounded. Throughout the charging and associated switching operations a capacitor of a smoothing filter connected following the precision rectifier circuit is disconnected from ground to isolate the smoothing filter output from ground and to prevent switching transients from affecting the charge of this capacitor.

11 Claims, 3 Drawing Figures

APPARATUS FOR CONVERTING AN A.C. INPUT SIGNAL TO A RECTIFIED AND SMOOTHED D.C. SIGNAL

This invention relates to apparatus for converting an a.c. input signal to a rectified and smoothed d.c. signal.

It is frequently required in telephony test equipment to convert accurately an a.c. input signal to a corresponding direct voltage. It is known to achieve this conversion by using a precision rectifier to produce a full-wave rectified signal from the a.c. input signal, and to smooth and filter the rectified signal to produce a constant direct voltage. The direct voltage is commonly converted in a logarithmic converter to a logarithmic representation of the magnitude of the a.c. input signal.

A disadvantage of such arrangements is that precision rectifiers generally have, and other circuits such as buffer amplifiers connected between the precision rectifier and the logarithmic converter invariably have, offset voltages associated with them. If the logarithmic converter includes a comparator which compares the direct voltage with a comparison voltage, then offset voltages are also associated with this comparator. The offset voltages give rise directly to errors in the conversion processes.

In order to compensate for such errors, it is known to provide offset adjustment circuits which are manually adjustable. However, these involve additional circuitry and necessitate adjustment, and the adjustments are subject to change as a result of shocks imparted to the apparatus. It is also known to use low-offset voltage components, but these are relatively expensive and do not completely remove the errors. Furthermore, neither of these known procedures overcomes the effects of offset voltage changes due to temperature changes and aging of the components.

Accordingly, it is an object of this invention to provide apparatus, for converting an a.c. input signal to a rectified and smoothed d.c. signal, in which errors due to offset voltages are compensated for.

According to this invention there is provided apparatus for converting an a.c. input signal to a rectified and smoothed d.c. signal, comprising a precision rectifier circuit, means for applying the a.c. input signal to an input of the precision rectifier circuit, a smoothing filter, including at least one capacitor; means coupling an output of the precision rectifier circuit to an input of the smoothing filter; a coupling capacitor; an amplifier having an inverting input and an output; means coupling an output of the smoothing filter via the coupling capacitor to the inverting input of said amplifier; and switching means selectively operable to disconnect the input of the precision rectifier circuit from the a.c. input signal, to open-circuit said at least one capacitor of the smoothing filter, and to connect the output of said amplifier to its inverting input, whereby when said switching means is operated the coupling capacitor is charged to a voltage dependent upon offset voltages of the apparatus and when said switching means is not operated the a.c. input signal is rectified and smoothed to produce a d.c. signal in which errors due to said offset voltages are compensated for by the charge of said capacitor.

Preferably the smoothing filter comprises a series resistor coupled between the input and the output of the smoothing filter and a shunt capacitor coupled between the output of the smoothing filter and a reference potential via a switch forming part of said switching means, said switch being opened when said switching means is operated.

Although offset voltages of the precision rectifier are compensated for in the apparatus, it is still preferable for offset voltages of the precision rectifier itself to be as small as possible, or preferably, zero. To this end the precision rectifier circuit preferably comprises two differential amplifiers each having an inverting input, a non-inverting input, and an output, means coupling the input of the precision rectifier circuit to said non-inverting inputs, a resistance and a capacitance connected in series between said inverting inputs, two diodes, each connected in a feedback path from, and poled to conduct current from, the output to the inverting input of an associated one of the amplifiers, two transistors, each having a controlled path connected between the output of the precision rectifier circuit and the inverting input of an associated one of the amplifiers and a control path connected in parallel with the associated diode, each transistor being arranged to conduct current via its controlled path when the associated diode is reverse biassed, and current-conductive means connected between the output of the precision rectifier circuit and a reference potential. Such a precision rectifier circuit forms the subject of co-pending U.S. patent application Ser. No. 110,474 filed concurrently herewith, entitled "Precision Rectifier Circuits" and assigned to the same assignee as this application.

In order to avoid the possibility of switching transients affecting the voltage to which the capacitor in the smoothing filter is charged, preferably the switching means is operable to open-circuit said at least one capacitor of the smoothing filter before, and to reconnect said at least one capacitor after, the switching operations at the input of the precision rectifier circuit and the input and output of said amplifier.

Where the apparatus is intended for use in conjunction with a logarithmic converter, preferably said amplifier also has a non-inverting input and constitutes a comparator, when said switching means is not operated, for comparing the voltage supplied from the coupling capacitor to its inverting input with a comparison voltage supplied to its non-inverting input, said switching means further comprising means for supplying the comparison voltage to the non-inverting input when said switching means is not operated and for connecting the non-inverting input to a reference potential when said switching means is operated. In such an arrangement the amplifier can constitute the input comparator of the logarithmic converter, whereby its offset voltages are compensated for. The switching operations in this case are effected during part of a period of the logarithmic converter operation during which the comparator output signal is not required, so that operation of the logarithmic converter is not adversely affected.

The invention will be further understood from the following description with reference to the accompanying drawings, in which.

Figure 1:
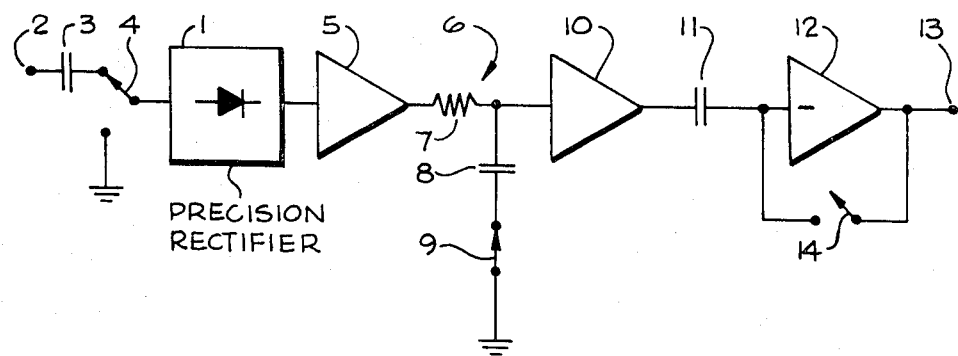
FIG. 1 is a schematic and block circuit diagram illustrating an embodiment of the invention.

Referring to FIG. 1, there is illustrated an embodiment of the invention with reference to which the principle of the invention will be described.

The apparatus of FIG. 1 includes a precision rectifier circuit 1 to an input of which an a.c. input signal is normally applied via an input terminal 2, a coupling capacitor 3, and a switch 4, which normally occupies the position shown. An output of the precision rectifier circuit 1 is connected via a buffer amplifier 5 to a smoothing filter 6 consisting of a series resistor 7 and a shunt capacitor 8 which is connected to circuit ground via a normally closed switch 9. The output of the smoothing filter 6 is connected via a buffer amplifier 10 and a coupling capacitor 11 to an inverting input of a buffer amplifier 12, whose output is connected to an output terminal 13 and can be connected to the inverting input via a normally open switch 14.

In operation with the switches in their positions shown, the precision rectifier circuit 1 produces at its output a full-wave rectified version of the a.c. input signal. This rectified signal is filtered, smoothed, and averaged by the filter 6, so that a direct voltage proportional to the magnitude of the a.c. input signal is produced across the capacitor 8. This direct voltage is coupled to the output terminal 13 via the amplifiers 10 and 12 and the capacitor 11.

The components 1, 5, 10 and 12 are subject to offset voltages which, being direct voltages, appear as an error in the direct voltage produced at the output terminal 13. The switches 4, 9 and 14 and the coupling capacitor 11 are provided to enable elimination of this error from the output voltage, without requiring the use of manual offset adjustments. For this purpose, the switches 4, 9 and 14 are operated, so that the switch 4 disconnects the input of the precision rectifier circuit from the a.c. input signal and connects it to ground, the switch 9 disconnects the capacitor 8 from ground, and the switch 14 connects the output of the amplifier 12 to its inverting input.

With the switches thus operated, no signal is applied to the input of the precision rectifier circuit 1 so that only its offset voltage appears at its output. This offset voltage is combined with that of the amplifier 5 and applied to the smoothing filter 6. By virtue of the opening of the switch 9, the capacitor stores the direct voltage, corresponding to the a.c. input signal magnitude, to which it has been charged and does not affect the offset voltage which is conducted to the amplifier 10. At the output of the amplifier 10, and hence at one terminal of the capacitor 11, there is produced a voltage which is the combined total of the offset voltages of the circuit 1 and the amplifiers 5 and 10. The negative feedback via the closed switch 14 causes the output offset voltage of the amplifier 12 to appear at its inverting input, and hence at the other terminal of the capacitor 11. In consequence, the capacitor 11 is charged to the total combined offset voltage of the apparatus, the time constant of this charging being determined by the capacitance of the capacitor 11 and the resistance of the switch 14.

When the capacitor 11 has been charged, the switches 4, 9, and 14 are returned to their positions shown in FIG. 1. Now the direct voltage coupled by the capacitor 11 to the input of the amplifier 12 is modified by the voltage to which the capacitor 11 is charged, and hence is accurately corrected for the offset voltage errors of the apparatus.

In practice, the above-described sequence of operation is repeated cyclically. As the capacitor 8 must have a relatively large capacitance, and hence time constant, in order to accommodate low frequency a.c. input signals, the switching of the capacitor 8 by the switch 9 has a negligible effect on the conversion accuracy of the apparatus. In order to prevent transients caused by switching from affecting the voltage stored by the capacitor 8, the switch 9 is arranged to be opened before and closed after the operation of the switches 4 and 14.

Figure 2:
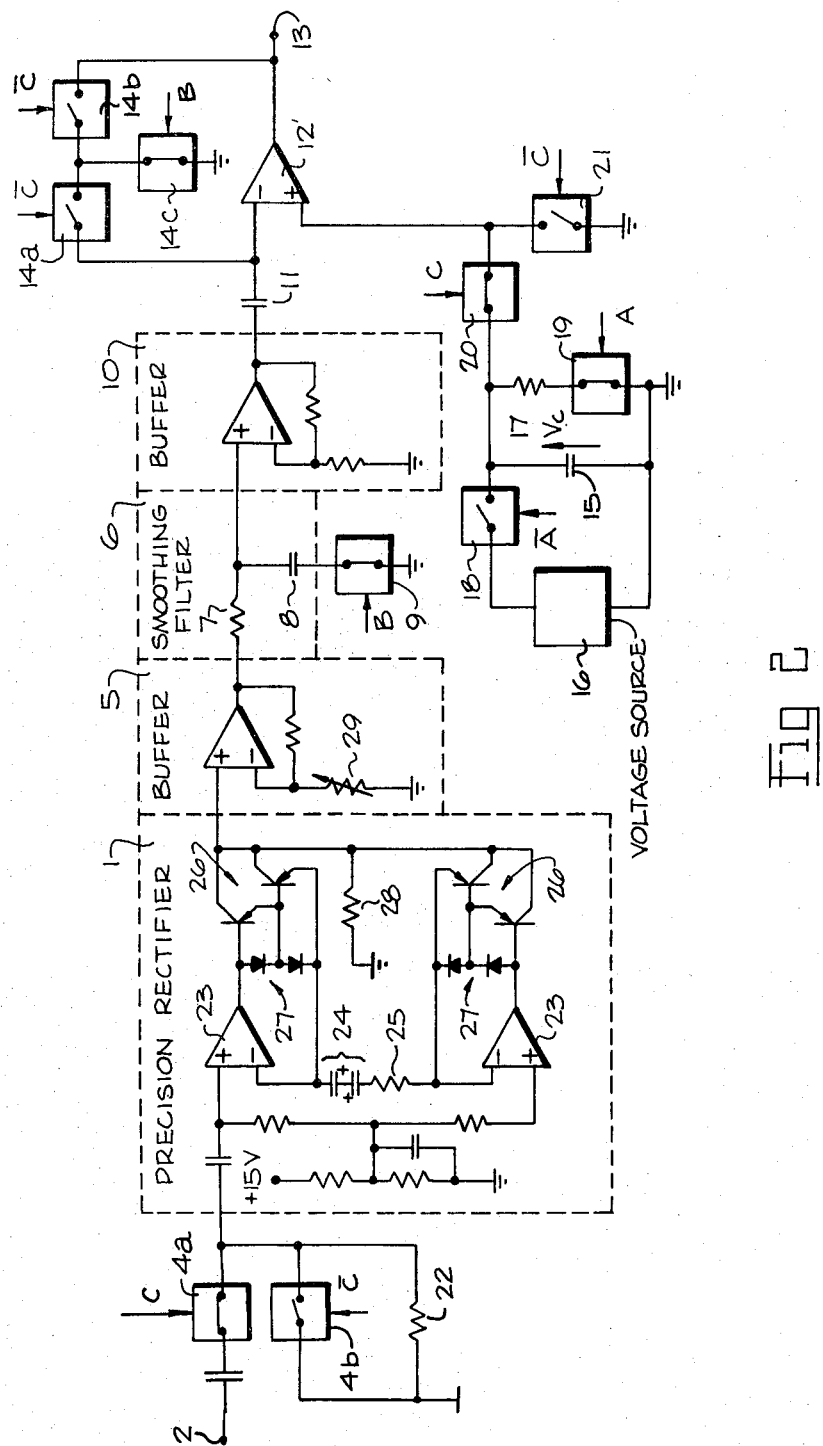
FIG. 2 is a detailed circuit diagram of a preferred embodiment of the invention incorporated in a logarithmic converter arrangement.

FIG. 2 illustrates in detail a preferred embodiment of the invention. The same references as those in FIG. 1 are used in FIG. 2 to denote corresponding components. The circuit of FIG. 2 is only described below in those respects where it differs from or is more detailed than that of FIG. 1.

The circuit of FIG. 2 is incorporated in a logarithmic converter arrangement which serves for producing a logarithmic representation of the a.c. input signal voltage applied to the input terminal 2. Whilst various forms of logarithmic converter can be used, the logarithmic converter itself is preferably of the type described with reference to FIGS. 3 and 4 of co-pending U.S. patent application Ser. No. 110,475 filed Jan. 8, 1980, entitled "Method of and Apparatus for Producing a Logarithmic Representation of an Input Voltage" and assigned to the same assignee as the present application. Such a logarithmic converter is of the so-called exponential decay type, in which a capacitor is charged to a reference voltage and is then discharged with a given time constant while the voltage across the capacitor is compared with an input voltage, thereby to produce at the output of the comparator a pulse whose duration is a logarithmic representation of the input voltage.

Figure 3:
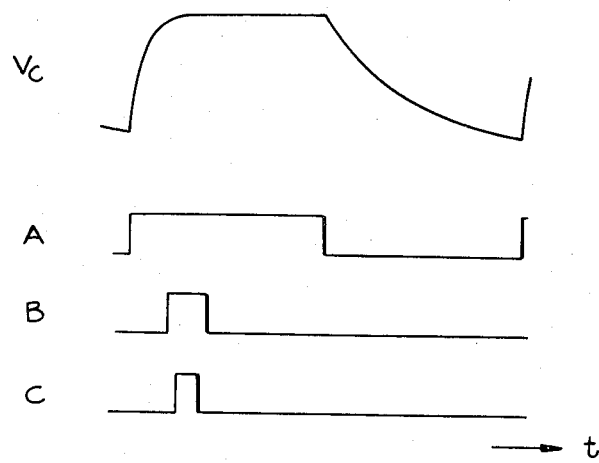
FIG. 3, which appears on the same sheet as FIG. 1, is a timing diagram relating to the operation of the circuit of FIG. 2.

Accordingly, as shown in FIG. 2 a capacitor 15 is arranged to be alternately charged to a reference voltage supplied by a voltage source 16 and discharged exponentially with a given time constant through a resistor 17 under the control of switches 18 and 19 which are alternately opened and closed under the control of signals $\overline{A}$ and A supplied thereto. FIG. 3 illustrates as a function of time t the signal A, signals B and C referred to below, and a voltage Vc which appears across the capacitor 15. Each of the switches 18 and 19, and each of the other switches shown in FIG. 2 and described below, can be Siliconix type DG200 and is closed when the respective control signal supplied to it is a logic '0.'

In the circuit of FIG. 2 the buffer amplifier 12 is replaced by a comparator 12' to whose inverting input the coupling capacitor 11 is connected and to whose non-inverting input the capacitor voltage Vc is normally applied via a switch 20 controlled by the signal C. The non-inverting input of the comparator 12' can be grounded via a switch 21 which is controlled by the signal $\overline{C}$, which also controls series-connected switches 14a and 14b in a negative feedback path around the comparator 12'. The junction between the switches 14a and 14b can be grounded via a switch 14c controlled by the signal B, which also controls the switch 9. The switches 14a, 14b, and 14c together constitute the switch 14 of FIG. 1. Whilst a single switch 14 could alternatively be used, if the comparator 12' has a bifet input as is preferably the case such a single switch must have a high 'off' impedance to avoid adverse effects on the comparator operation. The switching arrangement illustrated in FIG. 2 avoids this.

In FIG. 2, the switch 4 of FIG. 1 is constituted by switches 4a and 4b which are controlled by the signals C and $\overline{C}$. The input of the precision rectifier circuit 1 is also grounded via a resistor 22. The circuit 1 and the buffer amplifier 5 are described with reference to FIG. 4 of co-pending U.S. patent application Ser. No. 110,474 filed simultaneously herewith, entitled "Precision Rectifier Circuits" and assigned to the same assignee as the present application, the disclosure of which is incorporated herein by reference. In the circuit 1 the a.c. input signal is converted into a corresponding unipolar, full-wave rectified, signal which is substantially unaffected by input offset voltage differences of differential amplifiers 23 in the circuit. This is achieved by including a capacitance, constituted by oppositely poled series-connected capacitors 24, in series with a summing resistance 25, connected between inverting inputs of the amplifiers 23. Bipolar pnp transistors 26 provided in the circuit are Darlington-connected to provide high gain and thereby avoid the need for close matching. The transistors 26 have their base-emitter paths connected in parallel with, and poled oppositely to, series-connected diodes 27 poled to conduct current from the amplifier outputs to their inverting inputs, and their collectors connected to the output of the circuit 1, the output also being connected via a resistor 28 to circuit ground. The input of the circuit 1 is coupled to the non-inverting inputs of the amplifiers 23. The buffer amplifier 5 has an adjustable gain, adjustment being achieved by a variable resistor 29.

In operation of the circuit of FIG. 2, as already explained above, the capacitor 15 is alternately charged and discharged. Throughout the discharge the switches have the positions shown in FIG. 2, the signals A, B, and C all being a logic '0' as shown in FIG. 3. Consequently throughout the discharge the capacitor voltage Vc is compared in the comparator 12' with the direct voltage applied to the inverting input of the comparator 12' and produced by rectification and smoothing of the a.c. input signal, to produce at the output terminal 13 a pulse whose duration is a logarithmic representation of the a.c. input signal magnitude as desired for the log converter operation.

During charging of the capacitor 15, when the signal A is a logic '1' as shown in FIG. 3, the comparator 12' is not required to function as a comparator. During this period the offset voltage cancellation, already described with reference to FIG. 1, is effected. Thus as shown in FIG. 3, during a part of this charging period the signal B changes to a logic '1' to open the switches 9 and 14c. The signal C then changes to a logic '1' to open the switches 4a and 20 and to close the switches 4a, 14a, 14b, and 21. Consequently the comparator 12' now acts as a unity gain inverting amplifier, and the coupling capacitor 11 is charged to the total combined offset voltage of the apparatus as described with reference to FIG. 1. The signal C then changes back to a logic '0' to open the switches 4b, 14a, 14b, and 21 and to close the switches 4a and 20, and the signal B subsequently changes back to a logic '0' to close the switches 9 and 14c, whereby the switches again have their positions shown in FIG. 2 ready for the next discharge part of the cycle. This sequence is repeated in successive cycles of the log converter operation.

Thus it can be seen that compensation is provided for offset voltages of the apparatus without affecting operation of the log converter. By way of example, it is observed that a constructed form of the circuit of FIG. 2 completely compensated for an abnormally high offset voltage of 1.5 volts which was simulated by applying current to the inverting input of the buffer amplifier 10.

Numerous modifications, variations, and adaptations may be made to the embodiments of the invention described above without departing from the scope of the invention as defined in the claims. In particular, it is observed that different forms of precision rectifier circuit may be used, and the apparatus may be used in conjunction with different forms of log converter and in applications other than in conjunction with log converters. In addition, although only a simple form of smoothing filter 6 has been described above and shown in FIGS. 1 and 2, it should be appreciated that the smoothing filter could alternatively consist of a multiple stage passive filter, or an active filter, including one of more capacitors which are each switched in the same manner as described above for the capacitor 8.

What is claimed is:

1. Apparatus for converting an a.c. input signal to a rectified and smoothed d.c. signal, comprising:
   a precision rectifier circuit;
   means for applying the a.c. input signal to an input of the precision rectifier circuit;
   a smoothing filter including at least one capacitor;
   means coupling an output of the precision rectifier circuit to an input of the smoothing filter;
   a coupling capacitor;
   an amplifier having an inverting input and an output;
   means coupling an output of the smoothing filter via the coupling capacitor to the inverting input of said amplifier; and
   switching means selectively operable to disconnect the input of the precision rectifier circuit from the a.c. input signal, to open-circuit said at least one capacitor of the smoothing filter, and to connect the output of said amplifier to its inverting input, whereby when said switching means is operated the coupling capacitor is charged to a voltage dependent upon offset voltages of the apparatus and when said switching means is not operated the a.c. input signal is rectified and smoothed to produce a d.c. signal in which errors due to said offset voltages are compensated for by the charge of said capacitor.

2. Apparatus as claimed in claim 1 wherein the smoothing filter comprises a series resistor coupled between the input and the output of the smoothing filter and a shunt capacitor coupled between the output of the smoothing filter and a reference potential via a switch forming part of said switching means, said switch being opened when said switching means is operated.

3. Apparatus as claimed in claim 2 wherein said means coupling the output of the smoothing filter via the coupling capacitor to the inverting input of said amplifier comprises a buffer amplifier having an input connected to the output of the smoothing filter and an output connected via the coupling capacitor to said inverting input.

4. Apparatus as claimed in claim 1 wherein the precision rectifier circuit comprises:
   two differential amplifiers each having an inverting input, a non-inverting input, and an output;
   means coupling the input of the precision rectifier circuit to said non-inverting inputs;
   a resistance and a capacitance connected in series between said inverting inputs;
   two diodes, each connected in a feedback path from, and poled to conduct current from, the output to the inverting input of an associated one of the amplifiers;

two transistors, each having a controlled path connected between the output of the precision rectifier circuit and the inverting input of an associated one of the amplifiers and a control path connected in parallel with the associated diode, each transistor being arranged to conduct current via its controlled path when the associated diode is reverse biassed; and current-conductive means connected between the output of the precision rectifier circuit and a reference potential.

5. Apparatus as claimed in claim 4 wherein in the precision rectifier circuit each feedback path includes two series-connected diodes poled to conduct current from the output to the inverting input of the associated amplifier, and each of said two transistors is constituted by two Darlington-connected bipolar pnp transistors having their base-emitter paths connected in parallel with the associated series-connected diodes and their collectors connected to the output of the precision rectifier circuit.

6. Apparatus as claimed in claim 4 or 5 wherein said means coupling the output of the precision rectifier circuit to the input of the smoothing filter comprises a buffer amplifier having an adjustable gain.

7. Apparatus as claimed in claim 1, 2 or 4 wherein said means for applying the a.c. input signal to the input of the precision rectifier circuit comprises a coupling capacitor.

8. Apparatus as claimed in claim 1 wherein said switching means is operable to connect the input of the precision rectifier circuit to a reference potential when it is disconnected from the a.c. input signal.

9. Apparatus as claimed in claim 1 or 8 wherein said switching means is operable to open-circuit said at least one capacitor of the smoothing filter before, and to reconnect said at least one capacitor after, the switching operations at the input of the precision rectifier circuit and the input and output of said amplifier.

10. Apparatus as claimed in claim 1 or 8 wherein said amplifier also has a non-inverting input and constitutes a comparator, when said switching means is not operated, for comparing the voltage supplied from the coupling capacitor to its inverting input with a comparison voltage supplied to its non-inverting input, said switching means further comprising means for supplying the comparison voltage to the non-inverting input when said switching means is not operated and for connecting the non-inverting input to a reference potential when said switching means is operated.

11. Apparatus as claimed in claim 9 wherein said amplifier also has a non-inverting input and constitutes a comparator, when said switching means is not operated, for comparing the voltage supplied from the coupling capacitor to its inverting input with a comparison voltage supplied to its non-inverting input, said switching means further comprising means for supplying the comparison voltage to the non-inverting input when said switching means is not operated and for connecting the non-inverting input to a reference potential when said switching means is operated.

* * * * *